US008588261B2

(12) United States Patent
Caird et al.

(10) Patent No.: US 8,588,261 B2
(45) Date of Patent: Nov. 19, 2013

(54) METHOD AND SYSTEM FOR SUPPRESSION OF STIMULATED RAMAN SCATTERING IN LASER MATERIALS (76) Inventors: John A. Caird, San Francisco, CA (US); Andrew J. Bayramian, Manteca, CA (US); Christopher A. Ebbers, Pleasanton, CA (US)

( * ) Notice: Subject to any disclaimer, the term of this patent is extended or adjusted under 35 U.S.C. 154(b) by 360 days.

(21) Appl. No.: 13/048,628

(22) Filed: Mar. 15, 2011

(65) Prior Publication Data
US 2012/0236882 A1 Sep. 20, 2012

(51) Int. Cl.
H01S 3/10 (2006.01)
F21V 9/00 (2006.01)
G02B 5/02 (2006.01)
G02C 7/10 (2006.01)
G02F 1/361 (2006.01)
G03B 11/00 (2006.01)
H01S 3/30 (2006.01)

(52) U.S. Cl.
USPC ............. 372/9; 252/582; 252/584; 372/3; 372/20; 372/21; 372/108

(58) Field of Classification Search
USPC ............ 252/582, 584; 372/3, 9, 20, 21, 108
See application file for complete search history.

(56) References Cited

U.S. PATENT DOCUMENTS

| | | | |
|---|---|---|---|
| 5,410,428 | A | 4/1995 | Yamagata et al. |
| 5,818,649 | A | 10/1998 | Anderson |
| 6,810,197 | B2 | 10/2004 | Allan et al. |
| 6,870,999 | B2 | 3/2005 | Allan et al. |
| 2008/0108000 | A1 | 5/2008 | Wu Wei et al. |

OTHER PUBLICATIONS

Chris A. Ebbers, Jim Happe, Norm Nielsen, and Stephan P. Velsko, Optical absorption at 1.06 um in highly deuterated potassium dihydrogen phosphate,Applied Optics I vol. 31, No. 12 1 Apr. 20, 1992, 1992 Optical Society of America.*
Smith, et al., "Spontaneous and Stimulated Raman Scattering in KDP and Index-Matching Fluids", Frequency Conversion Systems, pp. 6-61 through 6-69, (Feb. 25, 1983).
Barker, et al., "Transverse Stimulated Raman Scattering in KDP", SPIE vol. 2633, 501, (Sep. 12, 1995).
Bel'kov, et al., "Stimulated Raman Scattering In Frequency Conversion Crystals", SPIE, vol. 2633, 506-512, (Sep. 12, 1995).
Basiev, et al., "Raman Spectroscopy of Crystals for Stimulated Raman Scattering", Optical Materials, 11, 307-314 (Mar. 1999).
Bayramian, et al., "Consideration of Stimulated Raman Scattering In Yb: Sr5(PO4)3F Laser Amplifiers", Applied Optics, vol. 39, No. 21, pp. 3746-3753 (Jul. 20, 2000).
Lu, et al., "Neodymium doped yttrium aluminum garnet (Y3Al5O12) nanocrystalline ceramics—a new generation of solid state laser and optical materials", Journal of Alloys and Compounds, 341, pp. 220-225 (2002).
Kumar, et al., "Spectroscopic and Stimulated Emission Characteristics of Nd3+ in Transparent YAG Ceramics", IEEE Journal of Quantum Electronics, vol. 40, No. 6, pp. 747-758 (Jun. 2004).

* cited by examiner

Primary Examiner — Bijan Ahvazi
(74) Attorney, Agent, or Firm — Kilpatrick Townsend & Stockton (57) ABSTRACT A composition of matter is provided having the general chemical formula $K(H,D)_2P(^{16}O_x,^{18}O_y)_4$, where $x<0.998$ or $y>0.002$, and $x+y\approx 1$. Additionally, a method of fabricating an optical material by growth from solution is provided. The method includes providing a solution including a predetermined percentage of $(H,D)_2^{16}O$ and a predetermined percentage of $(H,D)_2^{18}O$, providing a seed crystal, and supporting the seed crystal on a platform. The method also includes immersing the seed crystal in the solution and forming the optical material. The optical material has the general chemical formula $K(H,D)_2P(^{16}O_x,^{18}O_y)_4$, where $x<0.998$ or $y>0.002$, and $x+y\approx 1$.

16 Claims, 9 Drawing Sheets

METHOD AND SYSTEM FOR SUPPRESSION OF STIMULATED RAMAN SCATTERING IN LASER MATERIALS

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

Non-linear effects in optical materials, including stimulated Brillouin scattering (SBS) and stimulated Raman scattering (SRS), are observed in association with high irradiance (W/cm$^2$) and high fluence (J/cm$^2$) laser systems. As a result of these nonlinear effects, laser system performance is adversely impacted. Therefore, there is a need in the art for improved methods and systems related to optical materials.

SUMMARY OF THE INVENTION

According to the present invention, techniques related to optical systems are provided. More particularly, embodiments of the present invention relate to systems for optical crystals and ceramics with mixed oxygen isotopes. Merely by way of examples, the invention has been applied to a deuterated potassium dihydrogen phosphate crystal, and to a ytterbium-doped strontium fluoro-apatite (Yb:SFAP) crystal (also referred to as fluorapatite crystal), both with an increased number of $^{18}$O atoms in comparison with the natural abundance of this isotope. The methods and systems described herein are also applicable to other optical materials suitable for use with amplifier and laser systems, including sapphire ($Al_2O_3$), crystalline silica ($SiO_2$), and other laser materials.

Embodiments of the present invention shift and broaden the Raman scattering spectra of optical materials by changing the mass of atoms involved in the molecular Raman-active vibration. By increasing the amount of the minor oxygen isotopes $^{17}$O and/or $^{18}$O relative to the main isotope $^{16}$O in an embodiment, the breadth of Raman-active vibrational frequencies is increased, but the strength at any single frequency is reduced, thereby reducing the level of SRS and enabling higher intensities of laser light to propagate in the material with reduced loss and/or reduced risk of damage resulting from the scattered light.

According to an embodiment of the present invention, a composition of matter having the general chemical formula comprising $K(H,D)_2P(^{16}O_x,^{18}O_y)_4$, is provided, where x<0.998 or y>0.002, and x+y≈1.

According to another embodiment of the present invention, a laser system is provided. The laser system includes an optical path and a gain medium disposed along the optical path.

The laser system also includes a material for harmonic generation disposed along the optical path. The material for harmonic generation includes an optical element having a chemical formula comprising $K(H,D)_2P(^{16}O_x,^{18}O_y)_4$, where x<0.998 or y>0.002, and x+y≈1.

According to yet another embodiment of the present invention, a method of fabricating an optical material by growth from solution is provided. The method includes providing a solution including a predetermined percentage of $(H,D)_2{}^{16}O$ and a predetermined percentage of $(H,D)_2{}^{18}O$ and providing a seed crystal. The method also includes supporting the seed crystal on a platform, immersing the seed crystal in the solution, and forming the optical material. The optical material has the general chemical formula $K(H,D)_2P(^{16}O_x,^{18}O_y)_4$, where x<0.998 or y>0.002, and x+y≈1.

Numerous benefits are achieved by way of the present invention over conventional techniques. For example, embodiments of the present invention provide optical materials suitable for use in harmonic conversion applications such as frequency doubling, tripling, quadrupling, and the like, nonlinear optical devices such as Pockels cells, optical gain media, polarization rotators, as well as wave-plates. The optical materials described herein are characterized by reduced Raman scattering, thereby increasing system performance and reducing the likelihood of damage to large optical elements susceptible to transverse and/or longitudinal Raman propagation. These and other embodiments of the invention along with many of its advantages and features are described in more detail in conjunction with the text below and attached figures.

DETAILED DESCRIPTION OF THE INVENTION

As discussed above, SBS and SRS are non-linear effects associated with high irradiance (W/cm$^2$) and high fluence (J/cm$^2$) laser systems. The inventors have determined that in some laser systems, the effects of SBS can be negated by adding bandwidth to the spectrum of the laser light. This solution works because the Brillouin scattering linewidth is very narrow and the increased bandwidth takes the laser light out of resonance with the material's acoustic vibrations, thereby reducing the intensity of scattering.

However, with respect to SRS, the Raman linewidth is often a large value. If the solution above were applied, the optical bandwidth required for suppression of Raman scattering would exceed the capacity of other system components to function properly. As an example, the wavelength sensitivity of frequency converter materials can result in reduction of the frequency conversion efficiency due to the large optical bandwidth.

The Raman scattering cross section increases linearly with the optical frequency, and the spontaneous scattering rate increases with the cube of the frequency. Thus, SRS is of particular concern for frequency tripling crystals used in high energy lasers such as those at the National Ignition Facility (NIF). Raman scattering in potassium dihydrogen phosphate (KDP) is of significant concern due to the strong Raman transition associated with the totally symmetric, "breathing mode" vibration of the tetrahedral phosphate ($PO_4$) radical with a Stokes energy shift near 913 $cm^{-1}$ (27.4 THz). Due to the large transverse aperture characteristic of high energy laser frequency conversion crystals (e.g., widths up to 40 cm in NIF), side scattering (at right angles to the propagation direction of the beam) is of particular concern. It will be noted that in addition to the breathing mode, other resonances of the phosphate tetrahedron, at other frequencies, are relevant to embodiments of the present invention.

The breathing mode discussed above is characterized by a narrow spectral linewidth because nearly all of the tetrahedra in a standard KDP crystal have oxygen atoms of exactly the same mass of oxygen ions at the periphery of the tetrahedron. In the breathing mode, the phosphorous ion is stationary, with the oxygen atoms oscillating in and out around a center point defined by the bond length. As described throughout the present specification, embodiments of the present invention utilize oxygen isotopes in the phosphate tetrahedral structure to modify the Raman resonance and improve useful optical performance.

The inventors have determined that deuteration of the KDP crystal tends to broaden and weaken the Raman gain. Without limiting embodiments of the present invention, the inventors believe that this gain broadening results from the partial substitution of deuterium for hydrogen in deuterated KDP (DKDP), which splits and broadens the $PO_4$ vibrational resonance, thereby reducing the peak gain. As an example, NIF uses frequency conversion crystals that are about 70% deuterated.

Embodiments of the present invention relate to fusion reaction chambers. Embodiments of the present invention are applicable to energy systems including, but are not limited to, a Laser Inertial-confinement Fusion Energy (LIFE) engine, hybrid fusion-fission systems such as a hybrid fusion-fission LIFE system, a generation IV reactor, an integral fast reactor, magnetic confinement fusion energy (MFE) systems, accelerator driven systems and others. In some embodiments, the energy system is a hybrid version of the LIFE engine, a hybrid fusion-fission LIFE system, such as described in International Patent Application No. PCT/US2008/011335, filed Sep. 30, 2008, titled "Control of a Laser Inertial Confinement Fusion-Fission Power Plant", the disclosure of which is hereby incorporated by reference in its entirety for all purposes.

For high average power lasers, such as those utilized in a LIFE system, the residual hydrogen present in partially deuterated DKDP raises an issue because of the modest amount of absorption of laser light at a wavelength of 1 µm. At high pulse repetition rates, this could lead to unacceptable heating of the frequency conversion crystals, which are typically thermo-mechanically fragile and have a small acceptable temperature range for efficient frequency conversion operation. One approach to solve this undesirable absorption is to use DKDP at 100% deuteration, thereby minimizing the deposition of thermal energy in the frequency converters of the high average power lasers. Unfortunately, full deuteration results in the Raman scattering resonance not being split, potentially resulting in high gain at the $PO_4$ Raman frequency.

According to embodiments of the present invention, a plurality of oxygen isotopes are utilized to modify the conventional $PO_4$ radical breathing mode so that it exhibits multiple resonant frequencies. As a result, the structures provided by embodiments of the present invention broaden the Raman resonance associated with the $PO_4$ radical and improve laser system performance.

Figure 1:
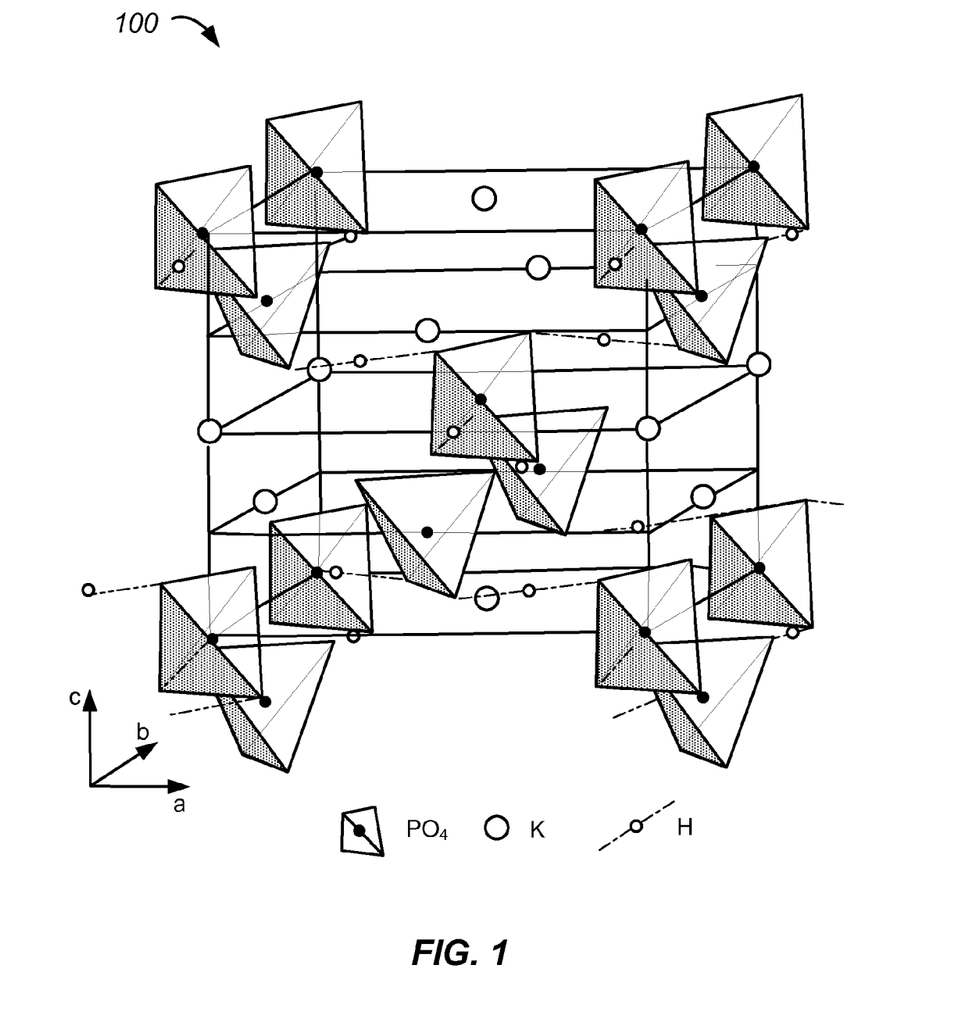
FIG. 1 is a simplified chemical model illustrating a potassium dihydrogen phosphate (KDP) crystalline unit cell according to an embodiment of the present invention.

FIG. 1 is a simplified chemical model illustrating a potassium dihydrogen phosphate (KDP) crystalline unit cell 100 according to an embodiment of the present invention. As illustrated in FIG. 1, the phosphate groups are connected by potassium and hydrogen bonds. For DKDP crystals, the chemical model is modified to replace one or more of the hydrogen bonds with deuterium bonds. One of ordinary skill in the art would recognize many variations, modifications, and alternatives.

The natural abundance of oxygen isotopes is about 99.8% oxygen 16 ($^{16}O$), 0.2% oxygen 18 ($^{18}O$), and 0.04% oxygen 17 ($^{17}O$). As a result, the $PO_4$ radical found in KDP and DKDP normally has all four oxygen ions of exactly the same mass, resulting in a breathing vibrational mode that is perfectly symmetric and uniform throughout the crystal. Substituting a high level of $^{18}O$ for $^{16}O$ will lead to several different combinations of oxygen masses in the $PO_4$ radical, namely:
four $^{18}O$;
three $^{18}O$ and one $^{16}O$;
two $^{18}O$ and two $^{16}O$;
one $^{18}O$ and three $^{16}O$; and
four $^{16}O$.
All of these structures have different breathing mode resonant frequencies because of the differing masses of the oxygen isotopes. The addition of $^{17}O$ to the mixture would further increase the number and breadth of the resonances.

An estimate of the potential shift of the Raman vibration can be obtained by noting that the frequency of the breathing mode will be inversely proportional to the square root of the mass of the oxygen nuclei. Thus, the breathing mode frequency of $P(^{18}O)_4$ will equal the square root of (16/18) multiplied by the breathing mode frequency of $P(^{16}O)_4$. Since the $P(^{16}O)_4$ frequency has been measured as 913 $cm^{-1}$ (27.4 THz), the $P(^{18}O)_4$ frequency is expected to be 861 $cm^{-1}$ (25.8 THz), a shift of 52 $cm^{-1}$, or 1.6 THz. This is substantial compared to the ~20 $cm^{-1}$ (0.6 THz) FWHM of the 913 $cm^{-1}$ Raman linewidth in KDP. Therefore, a substantial increase in the overall Raman bandwidth and a commensurate reduction in the peak Raman gain for a 50/50 mixed oxygen isotope DKDP crystal is achievable using embodiments of the present invention.

Referring to FIG. 1, the regularity of the $PO_4$ tetrahedra contribute to the narrow linewidth associated with the Raman resonance for the KDP/DKDP crystal. It should be noted that in non-crystalline materials, such as silicon-based glasses, the tetrahedra are variously stretched, compressed, and/or distorted such that these materials are characterized by a much broader Raman resonance linewidth. As a result, embodiments of the present invention are particularly applicable to crystalline systems.

Figure 2:
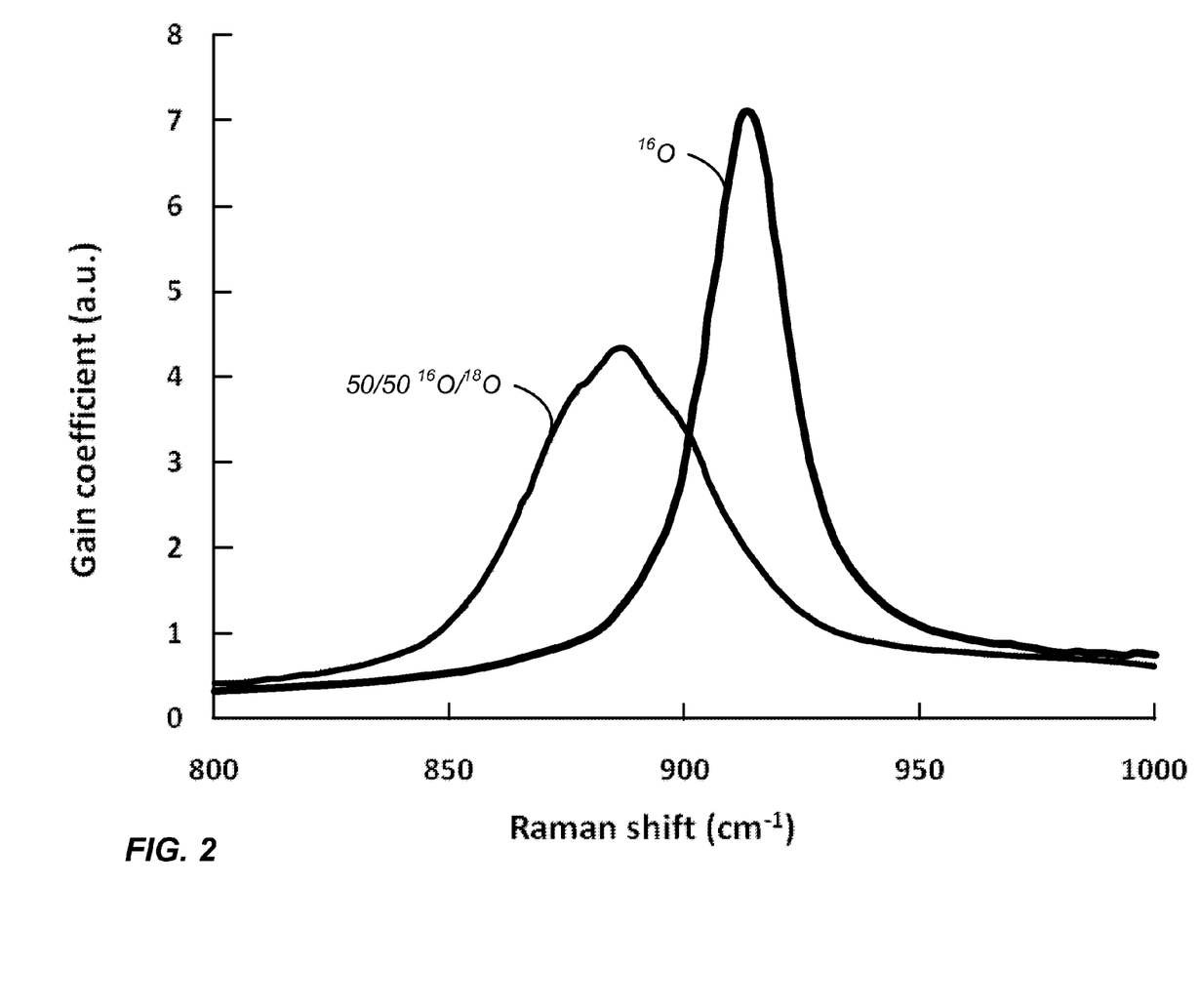
FIG. 2 is a simplified plot illustrating Raman gain for a KDP crystal with differing oxygen isotopes according to an embodiment of the present invention.

FIG. 2 is a simplified plot illustrating Raman gain for a KDP crystal with differing oxygen isotopes according to an embodiment of the present invention. Referring to FIG. 2, the Raman gain spectrum for $PO_4$ tetrahedra with $^{16}O$ isotopes and a 50/50 mixture of $^{16}O$ isotopes and $^{18}O$ isotopes is illustrated. The spectrum demonstrates a vibrational energy shift as a function of the inverse of the square root of the total oxygen mass. As illustrated in FIG. 2, the Raman gain for a KDP crystal with a standard concentration of oxygen isotopes ($^{16}O$) is characterized by a first gain spectrum with a peak at ~913 $cm^{-1}$ and a spectral bandwidth of ~20 $cm^{-1}$. As the concentration of $^{18}O$ isotopes is increased to 50% of the oxygen in the $PO_4$ tetrahedon, the Raman gain peak shifts to ~890 $cm^{-1}$ and the gain bandwidth is broadened to ~40 $cm^{-1}$. Thus, the addition of $^{18}O$ isotopes to the tetrahedron results in spectral broadening and a decrease in the peak Raman gain.

As discussed above, for mixtures of isotopes, the tetrahedral structures have different combinations of oxygen masses (e.g., four $^{18}O$; three $^{18}O$ and one $^{16}O$; and the like). The different tetrahedral structures will be characterized by different breathing mode resonant frequencies. This variation in breathing mode frequencies was utilized in computing the spectral broadening illustrated in FIG. 2. However, the actual spectral broadening will be even more pronounced than illustrated since the tetrahedral structure with a mixture of isotopes will not oscillate in the standard breathing mode, but a perturbed version of the breathing mode in which the oxygen atoms with differing masses will oscillate differently with respect to each other. The resulting perturbation of the breathing mode will be characterized by a modified frequency and the splitting of the Raman lines will be enhanced in comparison with the computation.

Embodiments of the present invention provide optical materials, for example, undeuterated KDP crystals, partially deuterated DKDP crystals, as well as DKDP crystals with near or up to 100% deuteration with isotopes of oxygen. The inventors have noted that the decrease in Raman scattering resulting from partial deuteration may be lost as the crystals become fully deuterated since the broadening resulting from replacement of hydrogen with deuterium is decreased as the crystal composition moves toward full deuteration. As an example, a particular embodiment provides a DKDP crystal with substantially 50% of $^{18}O$ substituted for $^{16}O$. As described more fully throughout the present specification, starting materials are utilized with sufficient isotopic purity to provide the predetermined isotope concentrations described herein. As will be evident to one of skill in the art, the water used in the growth process is not only $D_2O$ (i.e., heavy water), but can have a composition of ~50% $D_2^{16}O$ and 50% $D_2^{18}O$ in an embodiment. The embodiments described herein provide DKDP crystals with sufficiently low absorption loss at a wavelength of 1 μm to be used in high average power lasers, also suppressing Raman scattering of the frequency converted output, thereby allowing for higher output irradiance than available using conventional techniques. In some implementations, partial protonation of DKDP will be limited by the impact of $OH^-$ absorption on the system design. Embodiments of the present invention are not limited to KDP-based frequency conversion materials, but can also be applied to other nonlinear frequency conversion crystals such as potassium di-hydrogen arsenate (KDA), rubidium di-hydrogen arsenate (RDA), yttrium calcium oxy-borate (YCOB), lithium borate (LBO), beta barium borate (BBO), cesium lithium borate (CLBO), and the like.

Embodiments of the present invention are not limited to frequency conversion crystals, but are also applicable to a wide variety of optical materials including active laser materials. As examples, embodiments of the present invention can utilize a mixture of oxygen isotopes to reduce the effects of Raman scattering in active laser materials that contain chemical radicals similar to $PO_4$ as part of their structure. Thus, the performance limitations resulting from Raman scattering in $Yb:Sr_5(PO_4)_3F$ (Yb:SFAP) can be addressed by embodiments of the present invention. For this material, the bandwidth of the Raman resonance (0.084 Thz) is significantly less than in KDP (possibly due to the lack of hydrogen in this crystal), so the effect of using mixed oxygen isotopes can be even more effective than in KDP.

Figure 3:
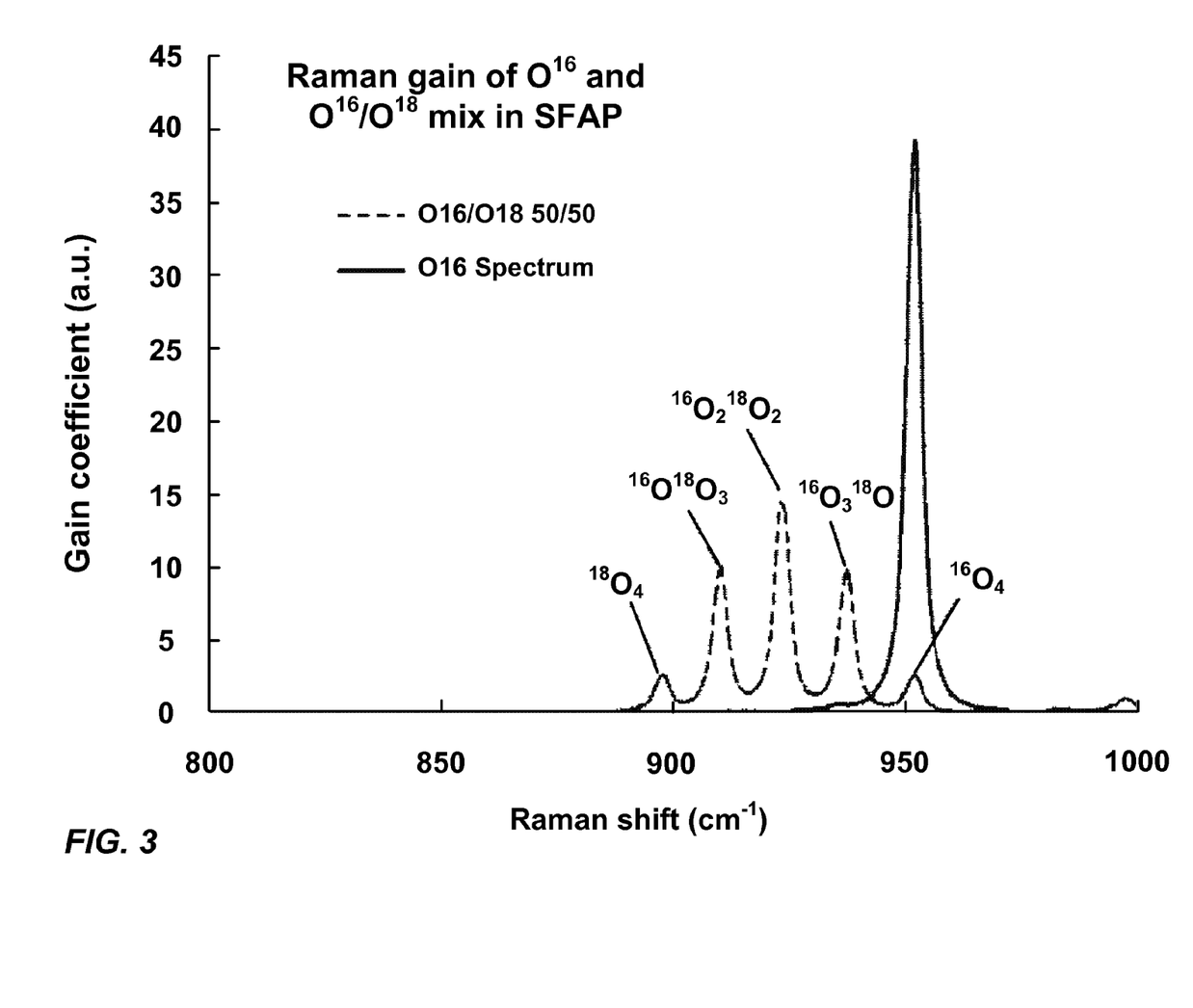
FIG. 3 is a simplified plot illustrating Raman gain for a strontium fluoro-apatite (SFAP) crystal with differing oxygen isotopes according to an embodiment of the present invention.

FIG. 3 is a simplified plot illustrating the Raman spectrum of SFAP near 950 $cm^{-1}$, along with a model spectrum for SFAP with a mixture of 50% $^{18}O$ substituted for $^{16}O$. It can be seen that the mixed oxygen isotopes substantially splits and reduces the maximum Raman scattering strength. For this material, the use of $^{17}O$ as well as $^{18}O$ is likely to be highly beneficial, since additional separate intermediate frequencies would result.

Figure 4:
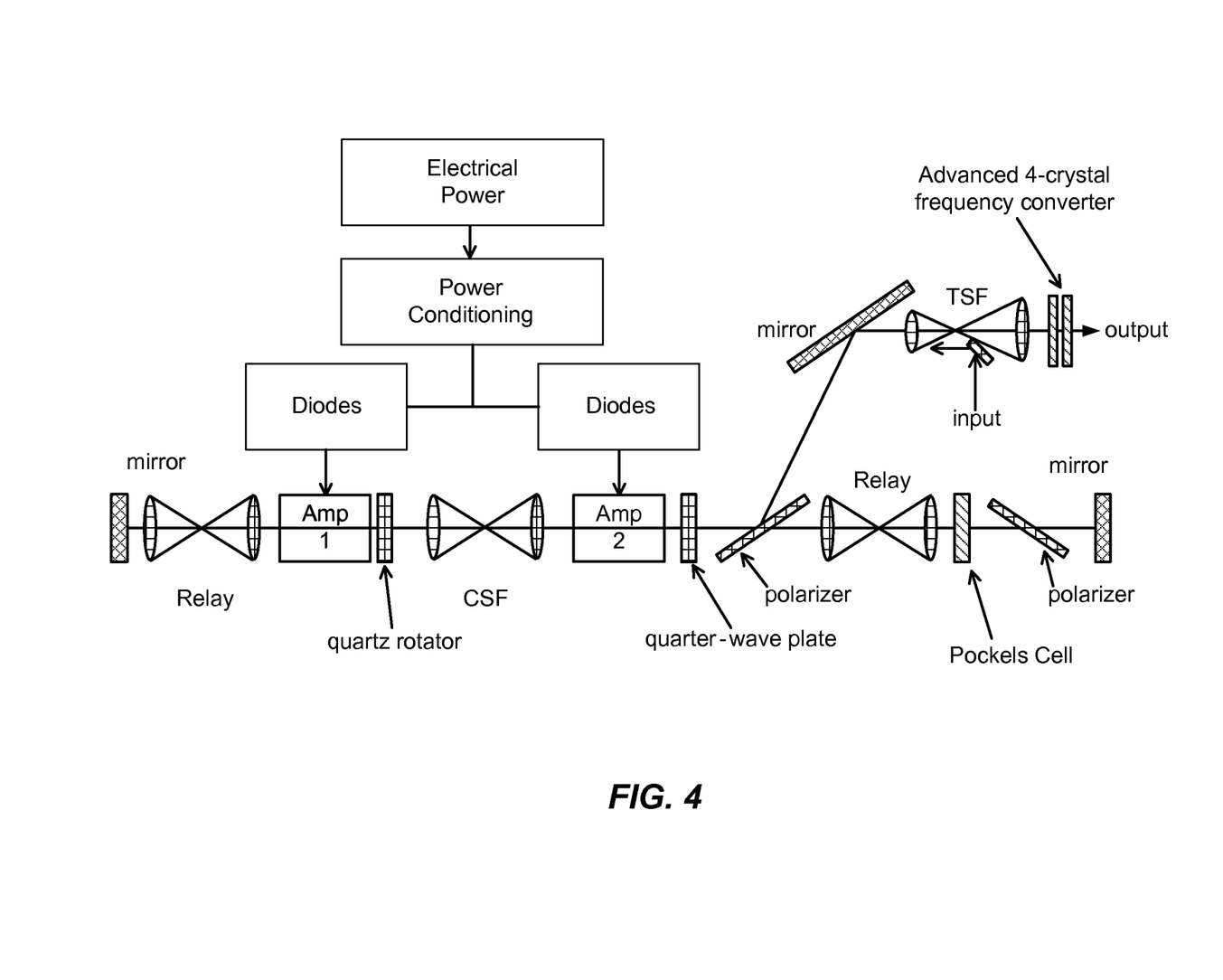
FIG. 4 is a simplified schematic diagram illustrating a laser system with various crystalline or ceramic components according to an embodiment of the present invention

FIG. 4 is a simplified schematic diagram illustrating a laser system with various crystalline or ceramic components according to an embodiment of the present invention. As illustrated in the embodiment shown in FIG. 4, oxygen isotopes are used to suppress Raman scattering in the active gain medium (Amp 1 and Amp 2) of a laser system based on, e.g. Yb:SFAP. In other embodiments the Yb:SFAP could be replaced by Yb:YAG (crystalline or ceramic), or any other crystalline or ceramic laser gain medium that has a narrow-band parasitic Raman resonance. The system illustrated in FIG. 4 also contains a crystalline quartz polarization rotator (quartz rotator), a sapphire quarter-wave plate, and a 4-crystal DKDP frequency converter, all of which could benefit from the substitution of $^{18}O$ for $^{16}O$ to reduce parasitic Raman scattering. It is not necessary for all such components to be present for the Raman suppression to be effective. A laser system may utilize any one or more of these components as appropriate to the various applications. One of ordinary skill in the art would recognize many variations, modifications, and alternatives.

Other embodiments of the present invention suppress Raman gain by substituting another alkaline earth cation for Sr in SFAP. As an example, some implementations substitute Ba for Sr up to 20% (i.e., $Sr_5(PO_4)_3F > Sr_4Ba_1(PO_4)_3F$ to provide an initial frequency shift (e.g., ~4 $cm^{-1}$ (0.12 Thz)) that can be increased to a greater subsequent frequency shift by use of the mixed oxygen isotope approach discussed herein.

As mentioned above, the methods and systems described herein are applicable to a wide variety of optical materials including crystalline laser host materials that exhibit distinct narrow-line Raman resonances. These crystalline laser host materials include yttrium aluminum garnet (YAG), other oxide garnets, tungstates ($WO_4$ or $WO_6$), molybdates ($MoO_4$), niobates ($NbO_4$ or $NbO_6$), Nitrates ($NO_3$), carbonates ($CO_3$), silicates ($SiO_4$), and the like. Because the Raman spectroscopy of many of these materials exhibits narrow linewidths, they are suitable candidates for substantial broadening through use of mixed oxygen isotopes. Neodymium- and/or Ytterbium-doped potassium gadolinium tungstate (KGd$(WO_4)_2$ or "KGW"), and oxide garnet ceramics, for example, are particular materials of recent industrial interest that can also benefit from the use of mixed oxygen isotopes as described herein.

The inventors have determined that the dominant Raman linewidth in YAG crystals (as well as YAG ceramic optical materials) is narrow compared to the potential shift in frequency due to the presence of other oxygen isotopes. As an example, the dominant Raman resonance at 370 $cm^{-1}$ (11.1 THz) in crystalline YAG and ceramic YAG have linewidths of 5.5 $cm^{-1}$ and 5.7 $cm^{-1}$ (0.17 THz), respectively, compared to the shift of approximately 21 cm$^{-1}$ (0.63 THz) provided by a high concentration of $^{18}$O. This would be of significant value in the development of Yb-doped YAG crystal and/or ceramic laser amplifier media.

According to one embodiment of the present invention, the Raman gain is weakened by substitution of different anions in the host matrix. As an example, such gain weakening is provided by the substitution of Ba for Sr in SFAP. Additionally, for a mixed garnet ceramic such as $YGd_2Sc_2Al_2GaO_{12}$, the dominant Raman linewidth remains narrow (~10 cm$^{-1}$ (0.3 THz)) despite the presence of a variety of anions in the crystallographic sites. Thus, even for these materials, a high concentration of an oxygen isotope such as $^{18}$O would further broaden and reduce the intensity of the Raman resonances.

Embodiments of the present invention differ from the use of mixed oxygen isotopes in other materials, for example, fiber optics. As will be evident to one of skill in the art, the broad spectrum of the Raman scattering in fused silica fiber results in a greatly reduced effect on Raman scattering in silica fiber through the use of mixed oxygen isotopes than that present in the optical materials discussed herein, including DKDP, SFAP, YAG, or KGW and other suitable crystals. The embodiments described herein are particularly suitable for use with crystalline materials having an ordered structure in comparison with materials having disordered structure such as that characteristic of glasses like fused silica.

A wide variety of optical systems can utilize the optical materials described herein. These optical systems include large aperture laser/amplifier systems that use KDP crystals and/or DKDP crystals for frequency conversion and/or optical switching. Such large aperture laser/amplifier systems can operate with an increased level of optical irradiance and/or the duration of optical pulses propagating through these devices while maintaining high transmission efficiency and/or providing a lower risk of damage. As examples, nonlinear optical elements such as frequency conversion devices and/or Pockels cells on large aperture laser systems including the NIF, the Z-Beamlet at Sandia National Laboratory, Albuquerque, N. Mex., the Omega-EP at Rochester, N.Y., just to name a few.

In addition to nonlinear optical elements, embodiments of the present invention are applicable to gain media including Yb:SFAP, calcium fluoride, strontium fluoride, rare-earth (RE)-doped potassium gadolinium tungstate (KGdWO$_4$), CaWO$_4$, Ba(NO$_3$)$_2$, CaMoO$_4$, LiNbO$_3$, calcium fluorapatite (Ca$_5$(PO$_4$)$_3$F), oxide garnets (e.g., crystalline or ceramic YAG), and the like. For active gain media implementations, a variety of amplifier architectures are suitable including rod amplifier geometries, slab amplifier geometries, and the like. It should be noted that rod amplifier geometries benefit from the present invention due to reductions in forward and backward scattering in the rod amplifier(s) in a manner similar to side scattering in slab amplifier geometries.

Figure 5:
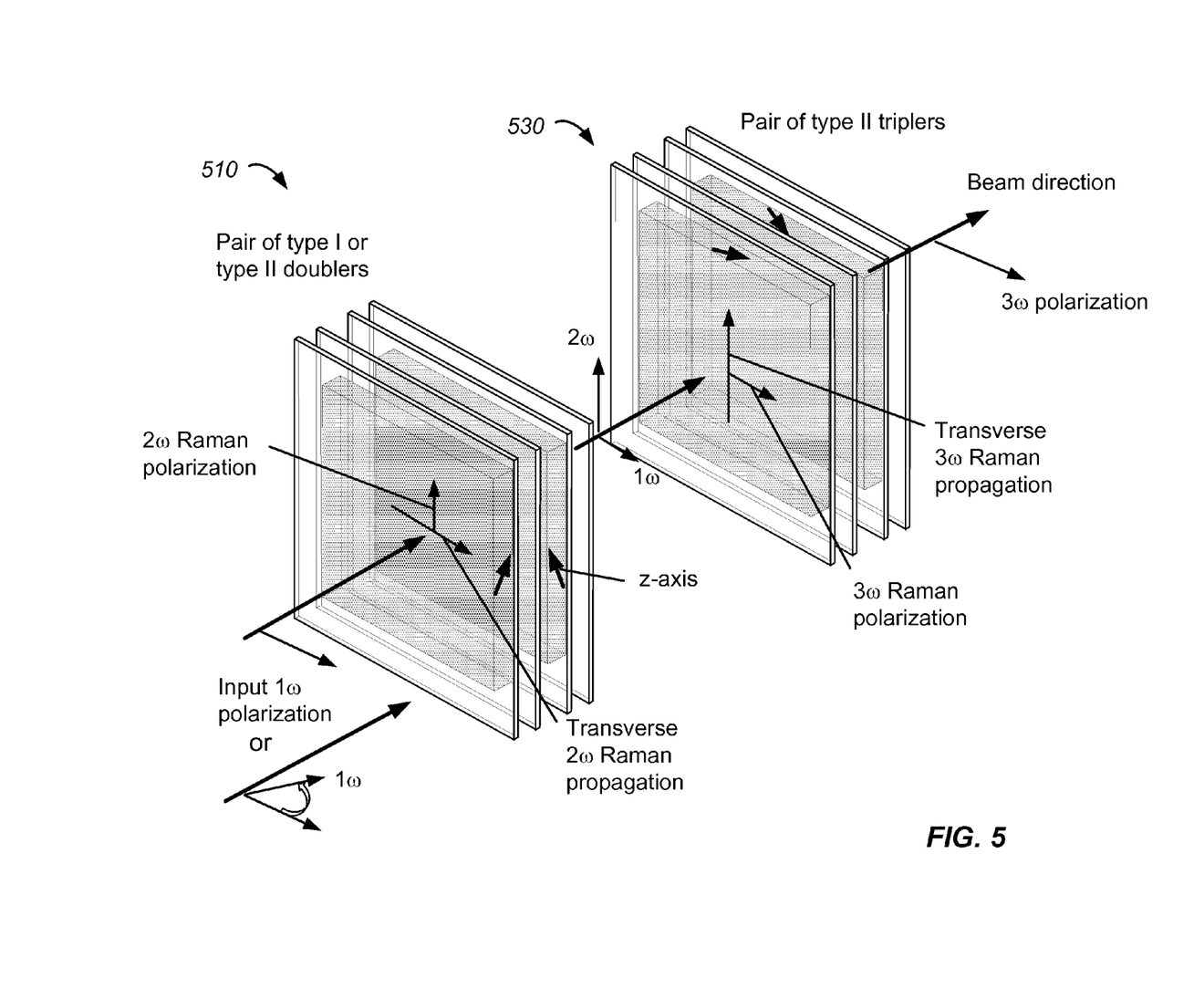
FIG. 5 is a simplified schematic diagram of a KDP/DKDP-based frequency conversion system according to an embodiment of the present invention.

FIG. 5 is a simplified schematic diagram of a KDP/DKDP-based frequency conversion system according to an embodiment of the present invention. As illustrated in FIG. 5, a first frequency conversion device 510 (i.e., a pair of Type I doublers) and a second frequency conversion device 520 (i.e., a pair of Type II triplers) are illustrated as components of a frequency conversion system. Although a pair of doublers and a pair of triplers are illustrated, this particular number of doublers and triplers is not required by the present invention and other numbers, including a single doubler or more than two doublers as well as a single tripler or more than two triplers are included within the scope of the present invention. It should be noted that in the schematic diagram illustrated in FIG. 5, a predetermined separation is illustrated between the frequency conversion units (i.e., the set of doublers and the set of triplers). In actual implementations, the actual space will typically be less than that illustrated, indicating that the drawing is not drawn to scale. In some embodiments, heat is removed from the components by flowing a cooling fluid in the space between the components, with a greater number of thinner components utilized in some situations to reduce the thermal load per component. One of ordinary skill in the art would recognize many variations, modifications, and alternatives.

Referring to FIG. 5, the first frequency conversion device 510 changes a predetermined percentage (e.g., a majority) of the 1ω input light polarized along the y-direction from the original frequency to twice the original frequency (i.e., 2ω) with a polarization orthogonal to the original polarization (i.e., 2ω light aligned with the x-direction as illustrated between the first and second frequency conversion devices). A second predetermined percentage of the 1ω input light remains at the original frequency with the original polarization as illustrated between the first and second frequency conversion devices. The predetermined percentage at the doubled frequency and the second predetermined percentage of the original frequency are converted in the second frequency conversion device 520 to produce a tripled beam (i.e., 3ω) with a polarization aligned with the 1ω input light propagating along the beam direction (i.e., the z-direction).

Referring to FIG. 5, 2ω Raman light (e.g., parasitic SRS) is illustrated in the first frequency conversion device 510 with a polarization aligned with the x-direction and a propagation direction aligned with the y-direction. Thus, as illustrated Raman scattered light is propagating in a direction transverse to the beam direction. In large aperture optics such as the large aperture crystals illustrated, the transverse propagation of the Raman light results in a significant gain length. In some implementations, the intensity of the Raman light can increase to the point at which the materials used in the optical system (e.g., the doubling or tripling crystals) are damaged. As described throughout the present specification, the use of differing oxygen isotopes reduces the Raman cross-section, ameliorating the issues presented by the architecture illustrated in FIG. 5.

The Raman light illustrated in the second frequency conversion device 520 is characterized by a polarization aligned with the y-direction and a propagation direction aligned with the x-direction, which is transverse to the beam direction and orthogonal to the Raman light illustrated in the first frequency conversion device 510.

In an alternative embodiment, the first frequency conversion device can include a pair of Type II doublers and the input beam can be oriented at an angle in order to produce the 1ω and 2ω beams between the first and second frequency conversion devices. As will be evident to one of skill in the art, the input beam can include components aligned with both the x-direction and the y-direction as appropriate to Type II doubling (i.e., two-thirds aligned with the y-direction and one-third aligned with the x-direction in this implementation).

As illustrated in FIG. 5, frequency conversion stages including large aperture crystals are provided by embodiments of the present invention. In these applications, parasitic Raman scattering is an issue that is reduced by the embodiments described herein. The inventors have noted that total internal reflection in the frequency conversion crystals significantly increases the potential parasitic gain length, enabling the methods and systems described herein to provide particular benefit in the illustrated application.

Figure 6:
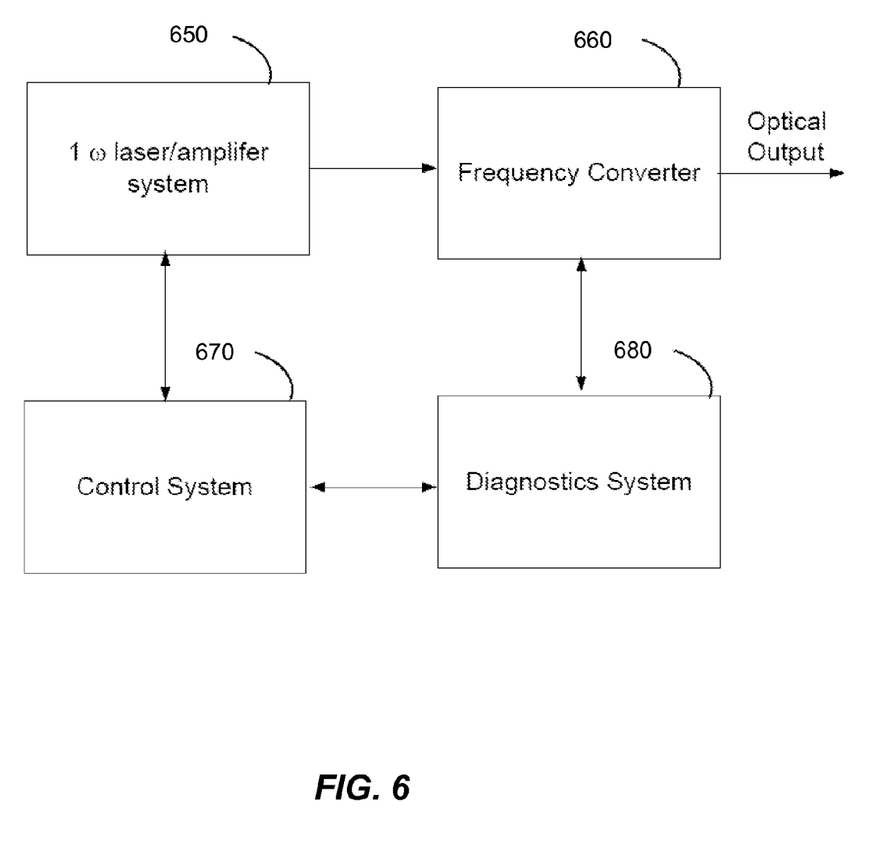
FIG. 6 is a simplified schematic diagram illustrating an optical system according to an embodiment of the present invention.

FIG. 6 is a simplified schematic diagram illustrating an optical system according to an embodiment of the present invention. As illustrated in FIG. 6, a 1ω laser or amplifier system 650 is provided with an optical output at 1ω (such a laser/amplifier system can be referred to as a 1ω beam box). As an example, the 1ω system could be a NIF laser beamline, a LIFE beamline, or the like. One or more optical elements including active optical elements are included within the laser/amplifier system 650 as will be evident to one of skill in the art, and previously depicted in FIG. 4. The term "1ω" refers to the fundamental optical frequency of the laser system and includes optical output at a variety of wavelengths depending on the laser gain medium in use.

The optical system also includes a frequency converter 660, which can include one or more frequency conversion elements as illustrated in FIG. 5. In some embodiments, the optical output produced by the frequency converter 660 is at 2ω and in other embodiments, the optical output is at 3ω. The frequency converter 660 includes optical materials including a tetrahedral structure with varying oxygen isotopes as described more fully throughout the present specification, for example, a KDP or DKDP (undeuterated, or partially or fully deuterated) crystal with a mixture of oxygen isotopes. One of ordinary skill in the art would recognize many variations, modifications, and alternatives. A control system 670 and a diagnostics system 680 are also provided in communication with the laser or amplifier system and the frequency converter. Control electronics, sensors, and the like are thus included within the scope of the present invention.

Figure 7:
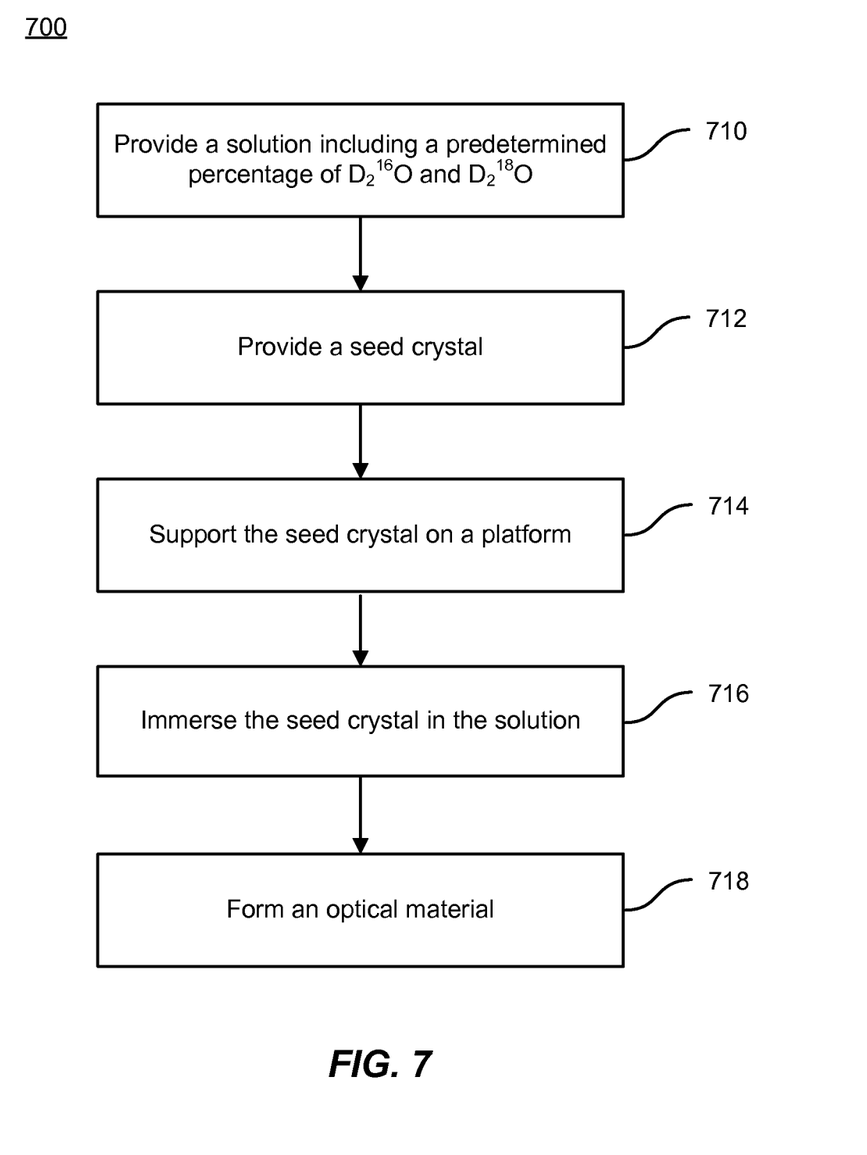
FIG. 7 is a simplified flowchart illustrating a method of fabricating an optical element by growth from solution according to an embodiment of the present invention.

FIG. 7 is a simplified flowchart illustrating a method of fabricating an optical element by growth from solution according to an embodiment of the present invention. The method 700 includes providing a solution including a predetermined percentage of $(H,D)_2{}^{16}O$ and a predetermined percentage of $(H,D)_2{}^{18}O$ (710). Thus, embodiments of the present invention are applicable to both deuterated and undeuterated material systems. The method also includes providing a seed crystal (712), supporting the seed crystal on a platform (714), and immersing the seed crystal in the solution (716). The method further includes forming the optical material (e.g., a crystalline structure), wherein the optical material has the general chemical formula comprising $K(H,D)_2P(^{16}O_x, {}^{18}O_y)_4$, where x<0.998 or y>0.002, and x+y≈1.

In some embodiments, the predetermined percentage of $(H,D)_2{}^{16}O$ is less than 99% and the predetermined percentage of $(H,D)_2{}^{18}O$ is greater than 1%. In a specific embodiment, the predetermined percentage of $(H,D)_2{}^{16}O$ ranges from about 99% to about 50% and the predetermined percentage of $(H,D)_2{}^{18}O$ ranges from about 1% to about 50%. In other embodiments, $^{17}O$ can be partially or fully substituted for at least one of $^{16}O$ or $^{18}O$.

It should be appreciated that the specific steps illustrated in FIG. 7 provide a particular method of fabricating an optical element by growth from solution according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
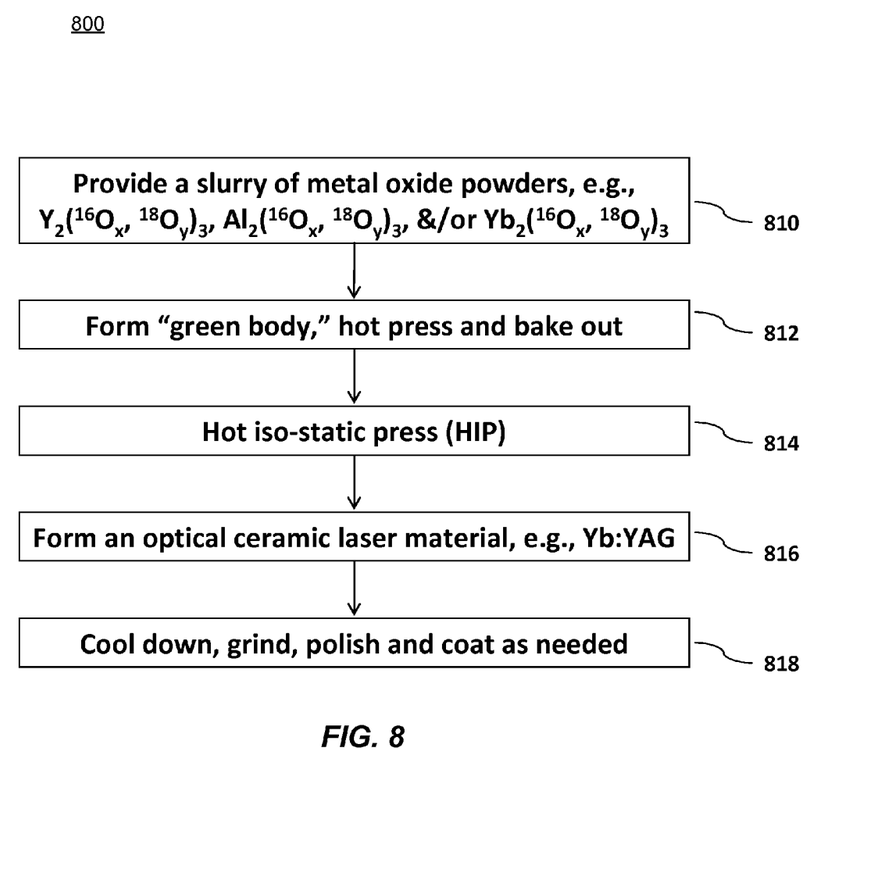
FIG. 8 is a simplified flowchart illustrating a method of fabricating an optical element by hot pressing powder into a ceramic according to an embodiment of the present invention.

FIG. 8 is a simplified flowchart illustrating a method of fabricating an optical element by hot pressing metal oxide powders into a ceramic according to an embodiment of the present invention. The method 800 includes providing a slurry of metal oxide powders (810). The metal oxide powders can include $Y_2(^{16}O_x, {}^{18}O_y)_3$, $Al_2(^{16}O_x, {}^{18}O_y)_3$, $Yb_2(^{16}O_x, {}^{18}O_y)_3$, where x<0.998 or y>0.002, and x+y≈1, or the like. Note that the relative proportions of $^{16}O$ and $^{18}O$ (i.e., x and y) need not be the same in the different metal oxides. The oxide powders are formed into a green body to undergo a hot press and bake out process (812). A hot iso-static press (HIP) process is used to form the optical material (814). As will be evident to one of skill in the art, HIP processing is a manufacturing process used to reduce the porosity of metals and increase the density of ceramic materials. The HIP process improves the mechanical properties and workability of the material processed. An optical ceramic laser material is formed, for example, Yb:YAG (816). After pressing, the optical ceramic laser material can be cooled, ground, polished, and/or coated as appropriate to the particular application (818).

It should be appreciated that the specific steps illustrated in FIG. 8 provide a particular method of fabricating an optical element by hot pressing metal oxide powders into a ceramic according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 9:
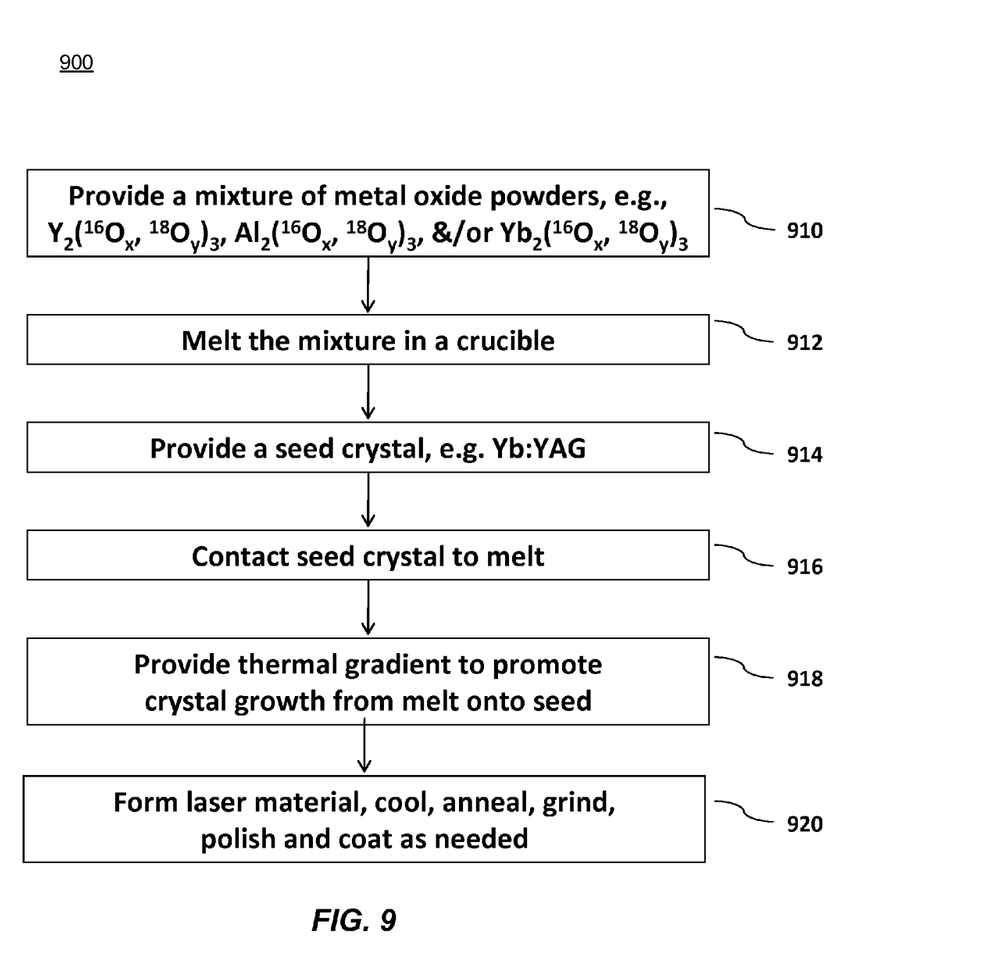
FIG. 9 is a simplified flowchart illustrating a method of fabricating an optical element by high temperature seeded crystal growth from molten material according to an embodiment of the present invention.

FIG. 9 is a simplified flowchart illustrating a method of fabricating an optical element by crystal growth from a molten metal oxide mixture into a crystal according to an embodiment of the present invention. The method 900 includes providing a mixture of metal oxide powders (910). The metal oxide powders can include $Y_2(^{16}O_x, {}^{18}O_y)_3$, $Al_2(^{16}O_x, {}^{18}O_y)_3$, $Yb_2(^{16}O_x, {}^{18}O_y)_3$, where x<0.998 or y>0.002, and x+y≈1, or the like. Note that the relative proportions of $^{16}O$ and $^{18}O$ (i.e., x and y) need not be the same in the different metal oxides. The oxide powders are melted in a crucible (912) and a seed crystal is provided (914). The seed crystal, e.g., Yb:YAG, is selected to provide a finished laser material suitable for the particular application.

The seed crystal is brought into contact with the melt (916) and a thermal gradient is provided to promote crystal growth from the melt onto the seed (918). Techniques related to crystal growth from a melt are included within the scope of the present invention as will be evident to one of ordinary skill in the art. The laser material is cooled, annealed, ground, polished, and/or coated after formation as needed for the particular application (920).

It should be appreciated that the specific steps illustrated in FIG. 9 provide a particular method of fabricating an optical element by growth from a molten metal oxide mixture into a crystal according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A composition of matter having the general chemical formula comprising $K(H,D)_2P(^{16}O_x,^{18}O_y)_4$, where $x<0.998$ or $y>0.002$, and $x+y\approx1$.

2. The composition of matter of claim 1, wherein (H,D) is substantially H.

3. The composition of matter of claim 1, wherein (H,D) is substantially D.

4. The composition of matter of claim 1, wherein (H,D) is substantially 30% H and 70% D.

5. The composition of matter of claim 1, wherein $x<0.99$, $y>0.01$.

6. The composition of matter of claim 5, wherein $x\approx0.5$ and $y\approx0.5$.

7. The composition of matter of claim 1, wherein $x+y\approx1$.

8. The composition of matter of claim 1, further comprising $^{17}O$ in place of all or part of at least one of the $^{16}O$ or $^{18}O$ component.

9. The composition of matter of claim 1, wherein the composition of matter comprises at least one of a crystalline or ceramic structure.

10. The composition of matter of claim 1, wherein a Raman gain coefficient of the composition is at least 10% less than a Raman gain coefficient of a material characterized by natural oxygen isotopic abundances.

11. A method of fabricating an optical material by growth from solution, the method comprising:
    providing a solution including a predetermined percentage of $(H,D)_2^{16}O$ and a predetermined percentage of $(H,D)_2^{18}O$;
    providing a seed crystal;
    supporting the seed crystal on a platform;
    immersing the seed crystal in the solution; and
    forming the optical material, wherein the optical material has the general chemical formula comprising $K(H,D)_2P(^{16}O_x,^{18}O_y)_4$, where $x<0.998$ or $y>0.002$, and $x+y\approx1$.

12. The method of claim 11, wherein the predetermined percentage of $(H,D)_2^{16}O$ is less than 99% and the predetermined percentage of $(H,D)_2^{18}O$ is greater than 1%.

13. The method of claim 11, wherein the optical material comprises a crystalline structure.

14. The method of claim 11, wherein:
    the predetermined percentage of $(H,D)_2^{16}O$ ranges from about 99% to about 50%; and
    the predetermined percentage of $(H,D)_2^{18}O$ ranges from about 1% to about 50%.

15. The method of claim 14, wherein:
    the predetermined percentage of $(H,D)_2^{16}O$ is about 50%; and
    the predetermined percentage of $(H,D)_2^{18}O$ is about 50%.

16. The method of claim 11, wherein the optical material includes $^{17}O$ partially or fully substituted for at least one of $^{16}O$ or $^{18}O$.

* * * * *